United States Patent [19]

Joshi

[11] Patent Number: 5,071,788

[45] Date of Patent: Dec. 10, 1991

[54] METHOD FOR DEPOSITING TUNGSTEN ON SILICON IN A NON-SELF-LIMITING CVD PROCESS AND SEMICONDUCTOR DEVICE MANUFACTURED THEREBY

[75] Inventor: Rajiv V. Joshi, Yorktown Heights, N.Y.

[73] Assignee: International Business Machines Corporation, Armonk, N.Y.

[21] Appl. No.: 654,409

[22] Filed: Feb. 8, 1991

Related U.S. Application Data

[63] Continuation of Ser. No. 157,026, Feb. 18, 1988, abandoned.

[51] Int. Cl.$^5$ ............................................ H01L 21/28
[52] U.S. Cl. .................................. 437/192; 437/245; 427/253; 428/620
[58] Field of Search ................ 437/192, 245; 427/253; 428/620

[56] References Cited

U.S. PATENT DOCUMENTS

| | | |
|---|---|---|
| 3,234,007 | 2/1966 | Blocher, Jr. et al. . |
| 3,881,242 | 5/1965 | Nuttall et al. . |
| 4,032,328 | 6/1977 | Hurd . |
| 4,343,676 | 8/1982 | Tarng ................................ 437/245 |
| 4,445,266 | 5/1984 | Mai et al. . |
| 4,477,277 | 10/1984 | D'Altilia et al. . |
| 4,503,601 | 3/1985 | Chiao . |
| 4,517,225 | 5/1985 | Broadbent ........................... 427/89 |
| 4,540,607 | 9/1985 | Tsao . |
| 4,552,783 | 11/1985 | Stoll et al. . |
| 4,584,207 | 4/1986 | Wilson . |
| 4,587,710 | 5/1986 | Tsao . |
| 4,595,608 | 6/1986 | King et al. . |
| 4,597,001 | 6/1986 | Bortscheller et al. . |
| 4,609,930 | 9/1986 | Yamazaki . |
| 4,616,401 | 10/1986 | Takeuchi ............................ 437/192 |
| 4,617,087 | 10/1986 | Iyer et al. . |
| 4,631,563 | 12/1986 | Iizuka . |
| 4,906,593 | 3/1990 | Shioya et al. ....................... 437/192 |

FOREIGN PATENT DOCUMENTS

0147913  10/1985  European Pat. Off. .

OTHER PUBLICATIONS

"Submicron Wiring Technology with Tungsten and Planarization", Kainta et al., IDEM 87–209.
"Submicron Tungsten Gate MOSFET With 10 mm Gate Oxide", Davori et al., Device Technology.
Wong, M., et al., "The Effects of Chemical Oxide on the Deposition of Tungsten by the Silicon Reduction of Tungsten Hexafluoride", J. of the Electrochemical Society, 134(9):2339 (1987).
Chen, J. Y. et al., "Refractory Metals and Metal Silicides for VLSI Devices", *Solid State Technology*, 27(8):145 (1984).
Busta, H. H., et al., "Film Thickness Dependence of Silicon Reduced LPCVD Tungsten on Native Oxide Thickness", *J. of the Electrochemical Society*, 133(6):1195 (1986).
Lifshitz, N., et al., "Selective Molybdenum Deposition by LPCVD", *J. of the Electrochemical Society*, 134(8A):2061 (1987).

*Primary Examiner*—Olik Chaudhuri
*Assistant Examiner*—Andrew Griffis
*Attorney, Agent, or Firm*—Scully, Scott, Murphy & Presser

[57] ABSTRACT

A method of depositing tungsten on a substrate utilizing silicon reduction wherein the process is non-limiting as to the thickness of silicon that may be converted to tungsten. A silicon substrate is provided with at least one area of silicon material having a predetermined thickness and the substrate is exposed to a tungsten hexafluoride gas flow in a chemical vapor deposition environment. By adjusting the $WF_6$ gas flow rate and the CVD process parameters, such as pressure, temperature and deposition time, the thickness of silicon converted to tungsten can be adjusted in order to convert the entire thickness. A novel structure having a midgap tungsten gate and tungsten source and drain metallized layers is also disclosed.

24 Claims, 7 Drawing Sheets

METHOD FOR DEPOSITING TUNGSTEN ON SILICON IN A NON-SELF-LIMITING CVD PROCESS AND SEMICONDUCTOR DEVICE MANUFACTURED THEREBY

This application is a continuation of application Ser. No. 157,026, filed on Feb. 18, 1988, now abandoned.

BACKGROUND OF THE INVENTION

1. Field of the Invention

This invention generally relates to the deposition of metal layers on a substrate and more particularly to CVD methods for selectively converting silicon to a refractory metal and to MOS semiconductor devices formed thereby.

2. Description of the Prior Art

In the manufacture of semiconductor devices there is a continuing desire to increase device density on the semiconductor chips in order to increase the resulting operating speeds of the device. The tight packing of devices on the chips places a premium on manufacturing techniques to meet the high standards of reliability necessary for such devices. In the manufacture of MOS devices, there has been considerable investigation of the deposition of refractory metals, such as tungsten and molybdenum. Refractory metals have excellent diffusion barrier properties and low contact resistance with silicon.

Presently, selective deposition of tungsten is performed by silicon and hydrogen reduction of tungsten hexafluoride gas. It is well known that tungsten may be deposited by only silicon reduction of tungsten hexafluoride according to the following equation:

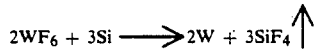

$$2WF_6 + 3Si \longrightarrow 2W + 3SiF_4 \uparrow$$

The prior art has taught, however, that silicon reduction is self-limiting and results in encroachment problems. The addition of hydrogen reduction is used to deposit tungsten in the desired thickness. The hydrogen reduction method, however, also results in severe encroachment problems. In addition, the selectivity in depositing tungsten strictly depends on the predeposition condition of the wafer, deposition chamber design, vacuum capability, the method of heating the substrate, and elaborate bake and purge cycles. Poor reproduceability, slow growth rates at turret temperatures below 400° C. (less than 10 nm per minute), and selectivity breakdown are the major drawbacks of this process. In addition, HF liberated in the hydrogen reduction process etches recess oxide isolation areas of the devices, resulting in penetration of tungsten hexafluoride along the oxide edges. Also, the density of exposed silicon determines the selectivity, therefore reducing the selectivity of the process.

Several prior art methods have been suggested to overcome the above problems in tungsten deposition. In the commonly assigned U.S. patent application Ser. No. 044,262, filed Apr. 30, 1987, the substrate, after being exposed to WF$_6$ gas to convert a limited thickness of silicon, a subsequent layer of silicon is deposited using a plasma deposition and the wafer is then again exposed to the WF$_6$ gas. These steps are repeated until the desired thickness of silicon is converted to tungsten. In U.S. Pat. No. 4,595,608, the substrate is periodically removed from the CVD deposition environment and moisture is applied to the areas on which tungsten is not to be deposited. The substrate is then redisposed in the CVD environment. The process uses tungsten and hydrogen reduction.

SUMMARY OF THE INVENTION

The present invention is directed to a method for depositing a layer of refractory metal on a substrate in a CVD environment utilizing only silicon reduction of a hexafluoride gas of the metal. The substrate is provided with one or more areas of silicon material having a predetermined thickness. The inventor has discovered that by adjusting one or more of the metal hexafluoride gas flow rate and the CVD process parameters, that the silicon reduction process is not self-limiting and that the desired thickness of the silicon material can be converted to the refractory metal. The process parameters that are adjusted include, temperature, total pressure, partial pressure on the metal hexafluoride gas, and carrier gas flow rates.

The method can be utilized to make semiconductor devices and metal interconnects between chip layers and may be utilized for planarization of via holes used for multi-level interconnects. In a novel semiconductor structure utilizing the inventive process, the source, drain and gate silicon is converted to tungsten in one step. The tungsten gate has a midgap work function and low resistivity making the device particularly useful for sub-half micron MOS devices.

In accordance with the method of making a semiconductor device, the substrate of silicon material is provided having a surface defining drain and source regions and a silicon gate having top, bottom and sidewalls of an insulator layer material disposed on the substrate surface adjacent the drain and source regions. In addition, recessed isolation regions are disposed adjacent the source and drain regions spaced from the silicon gate. The use of polysilicon for the gate material is well known, however, the present invention may also utilize single crystalline silicon or amorphous silicon. Silicon is selectively deposited on the source and drain regions by any suitable method, such as selective epitaxial growth. The top insulator layer of the gate is then removed by RIE or a wet etch process.

Thereafter, the substrate is exposed to the metal hexafluoride gas flow in a chemical vapor deposition environment and the gas flow rate and the CVD process parameters are adjusted to convert the silicon gate and the source and drain silicon to the refractory metal, up to the entire thickness of the silicon material if desired. In one embodiment, sidewall spacers of insulator material are selectively deposited on the source and drain silicon layers prior to exposing the substrate to the CVD process.

The thickness of the silicon on the source and drain regions should be substantially the same as the thickness of the silicon gate if a midgap gate work function is desired. The height differential between the source, drain and gate silicon material would result only from the gate oxide layer between the gate and the substrate. Thus, upon conversion of the entire thickness of the source-drain silicon regions, all of the silicon gate will be converted. Alternatively, the source and drain silicon may be grown to a thickness less than the thickness of the silicon gate. In this embodiment, only part of the silicon gate will be converted to the refractory metal upon conversion of the entire source and drain regions.

The process of the present invention permits semiconductor devices to be made without the prior art problems of encroachment and bridging. By avoiding the use of hydrogen in the reduction process, the problem of etching the recessed oxide isolation regions is also eliminated. The process is easily implemented in standard CVD process systems.

DETAILED DESCRIPTION OF THE INVENTION

Figure 1:
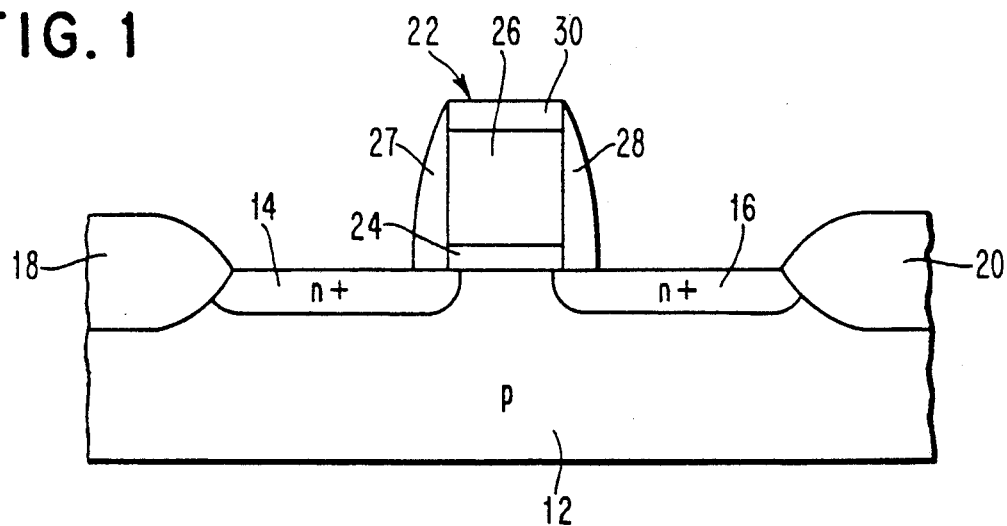
FIGS. 1-6 are cross-sectional representations of a MOS wafer showing sequentially the major fabrication steps employed in implementing the present invention.

Referring now to the drawings, FIG. 1 shows a silicon wafer after gate delineation using standard CMOS fabrication processes. The wafer includes a silicon substrate 12 and source and drain regions 14 and 16. The silicon substrate is shown having p-conductivity and the source and drain regions having n+conductivity. However, a p+source and drain and n substrate may also be utilized. The wafer also includes recessed isolation regions 18 and 20 which may be formed with silicon oxide or silicon nitride. Gate region 22 includes a gate oxide layer 24 and a silicon gate layer 26. The gate region 22 also includes sidewalls 27 and 28 and top wall 30 made of an insulator material such as $SiO_2$ or $Si_3N_4$. The silicon used for the substrate 12 and the gate layer 26 may be any of the silicon structures of single crystal silicon, polycrystalline silicon or amorphous silicon. In the preferred embodiment, substrate 12 is single crystal silicon and the gate layer 26 is polycrystalline silicon. Typically, the gate oxide region 24 is about 12.5 nm thick. The gate silicon is about 400 nm thick and the sidewall and spacers are about 150 nm wide. The top wall layer is typically about 20 nm thick. The above dimensions are provided for example only as any suitable configuration may be used in the inventive process.

Figure 2:
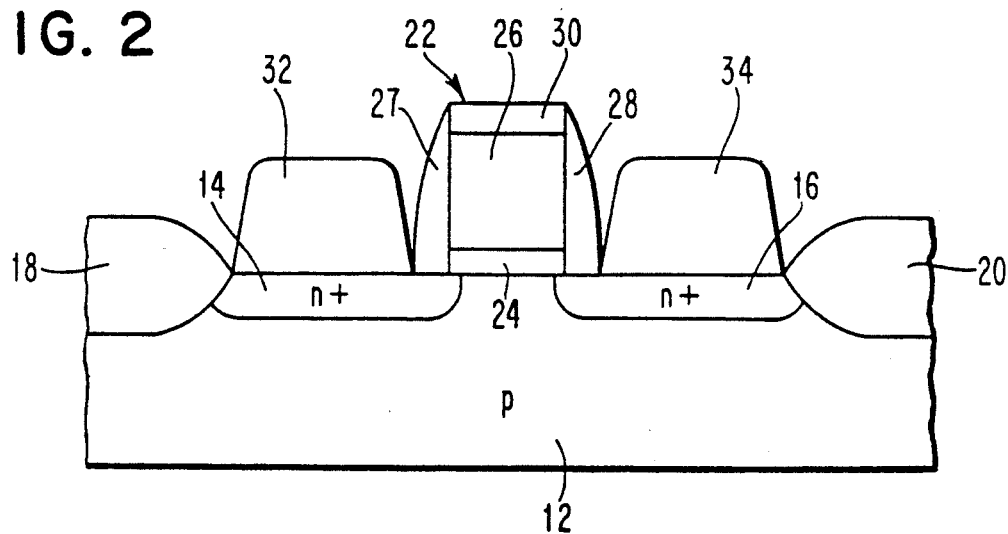

As shown in FIG. 2, source and drain silicon layers 32 and 34 are grown onto source and drain regions 14 and 16. The source and drain silicon regions 32 and 34 are preferably selectively epitaxially grown, however, they may be grown by any known manner. Regions 32' and 34 have any desired thickness and are not limited to what may be characterized as the "critical" thickness. The "criticial" thickness is that thickness at which the reaction between a semiconductor material and a refractory metal hexafluoride becomes self-limiting. For example, the conversion of silicon to tungsten normally stops at a thickness which is in the range of 20-30 nm.

Figure 3:
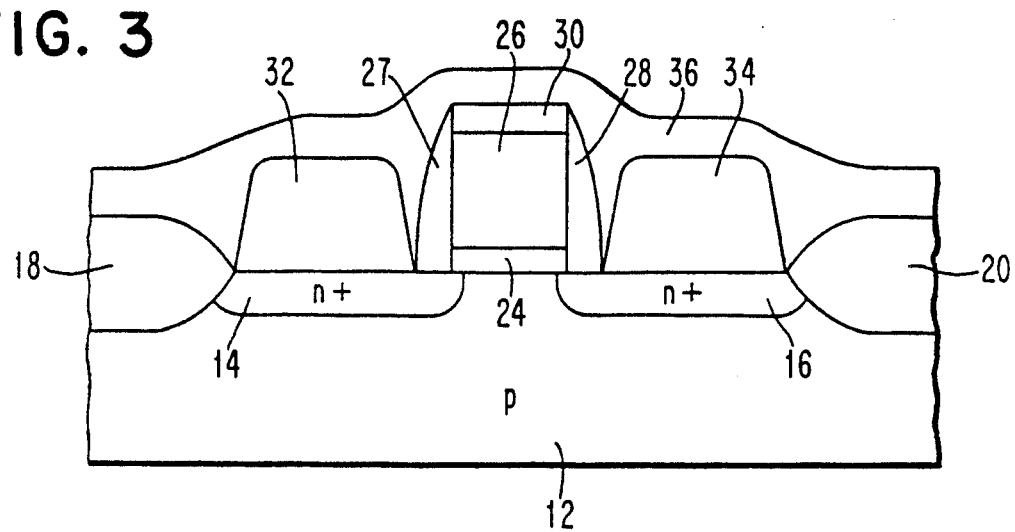
Figure 4:
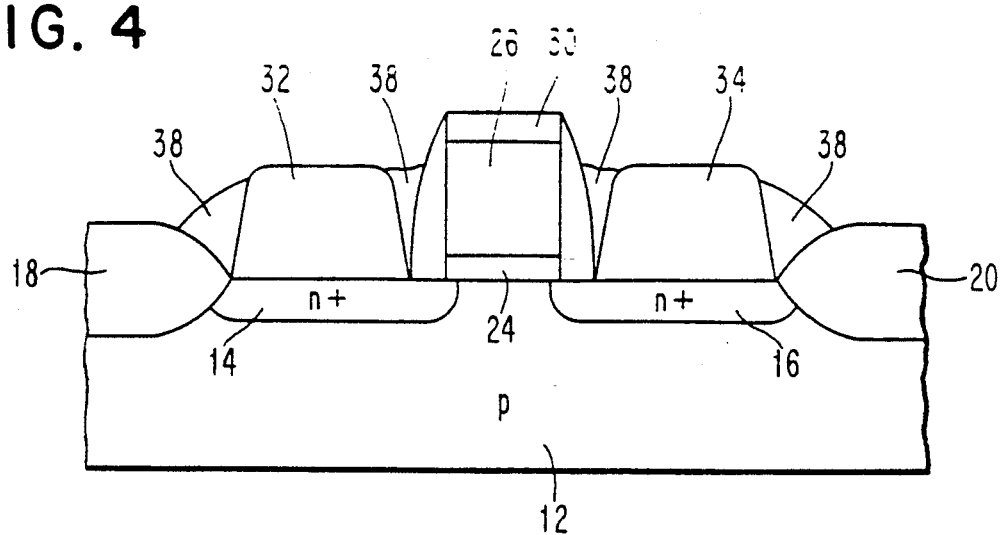
Figure 5:
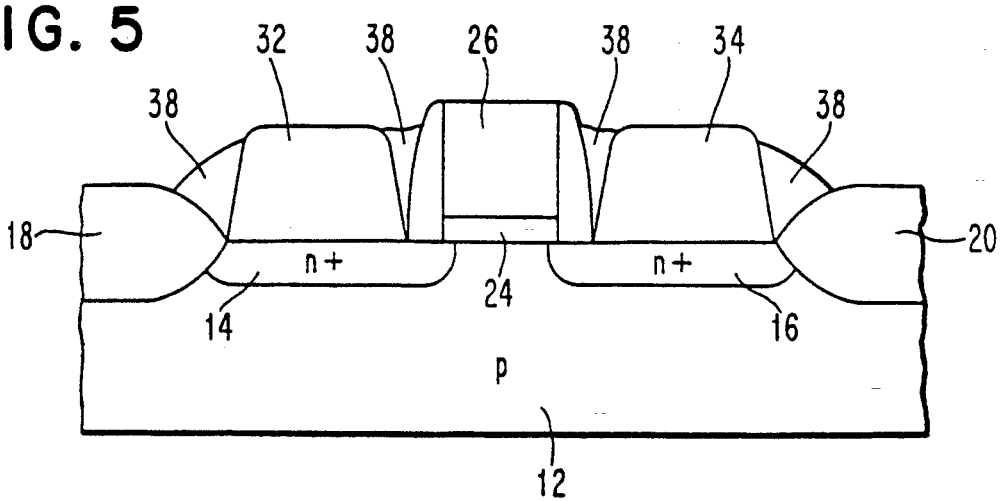

As shown in FIG. 3, a blanket layer 36 of insulator material, such as $SiO_2$ or $Si_3N_4$, is deposited over the entire substrate. The blanket layer 36 is then selectively etched by, for example, reactive ion etching in order to leave sidewall spacers 38 for the silicon source and drain layers 32 and 34. The top insulator layer 30 is then removed by RIE or chemical wet etch to leave the structure shown in FIG. 5.

Figure 6:
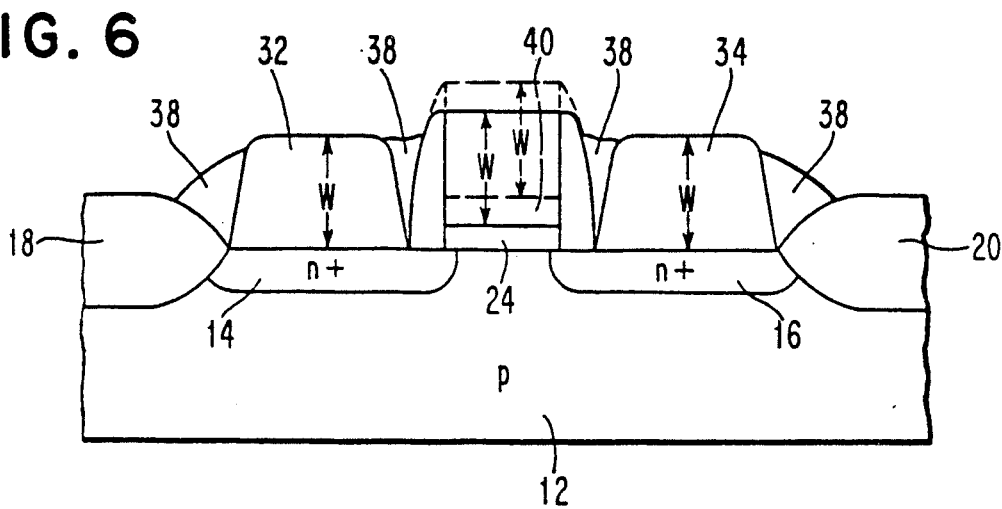

The structure is then exposed to a refractory metal hexafluoride gas flow in a chemical vapor deposition environment in order to convert the silicon areas 26, 32 and 34 to the selected refractory metal. As shown in FIG. 6, regions 26, 32 and 34 are completely converted to tungsten.

The total conversion of regions 26, 32 and 34 may be accomplished when the thicknesses of each of the regions are substantially the same. The resulting device, having a height differential between the source-drain and the gate defined only by the gate oxide layer has been determined to exhibit a midgap gate work function. The midgap work function results in desired threshold voltages of ±0.6 V, without the need for channel implants into n or p-channel devices. This avoids the inferior buried-channel operation of PMOS and at the same time yields a higher mobility and transconductance for NMOS.

However, it may be desirable to convert only a portion of the gate silicon to tungsten. In this embodiment, the thickness of the silicon deposited on the source and drain regions is less than the gate silicon. The conversion process is then performed so as to convert the entire source and drain silicon regions to tungsten and a corresponding thickness of the gate silicon. An example of the embodiment is shown in phantom in FIG. 6, where it can be seen that the silicon portion 40 is not converted.

The process for converting the selected silicon areas on the substrate utilizes silicon reduction of a metal hexafluoride gas. It is well known that silicon may be reduced to tungsten in accordance with the following equation:

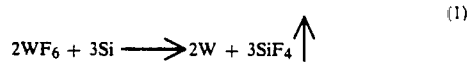

$$2WF_6 + 3Si \longrightarrow 2W + 3SiF_4 \uparrow \quad (1)$$

In addition, it is known that silicon may reduce to moylbdenum in accordance with the following equation:

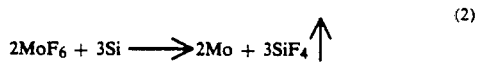

$$2MoF_6 + 3Si \longrightarrow 2Mo + 3SiF_4 \uparrow \quad (2)$$

Tungsten has been shown to be especially useful for metallization of contacts because of its barrier properties and low contact resistance with silicon. In the present invention, the source, drain and gate are metallized with tungsten in a single step. The tungsten gate provides a midgap work function of approximately 4.8 ev.

The inventor has determined that by adjusting one or more of the tungsten hexafluoride gas flow rate and other CVD process parameters such as temperature, total pressure, partial pressure of the $WF_6$ gas and the carrier gas flow rate, that the silicon reduction of tungsten is not self limiting as shown in the prior art. Thus, the total thickness of the gate, source and drain silicon layers can be converted to tungsten in a single step.

Figure 7:
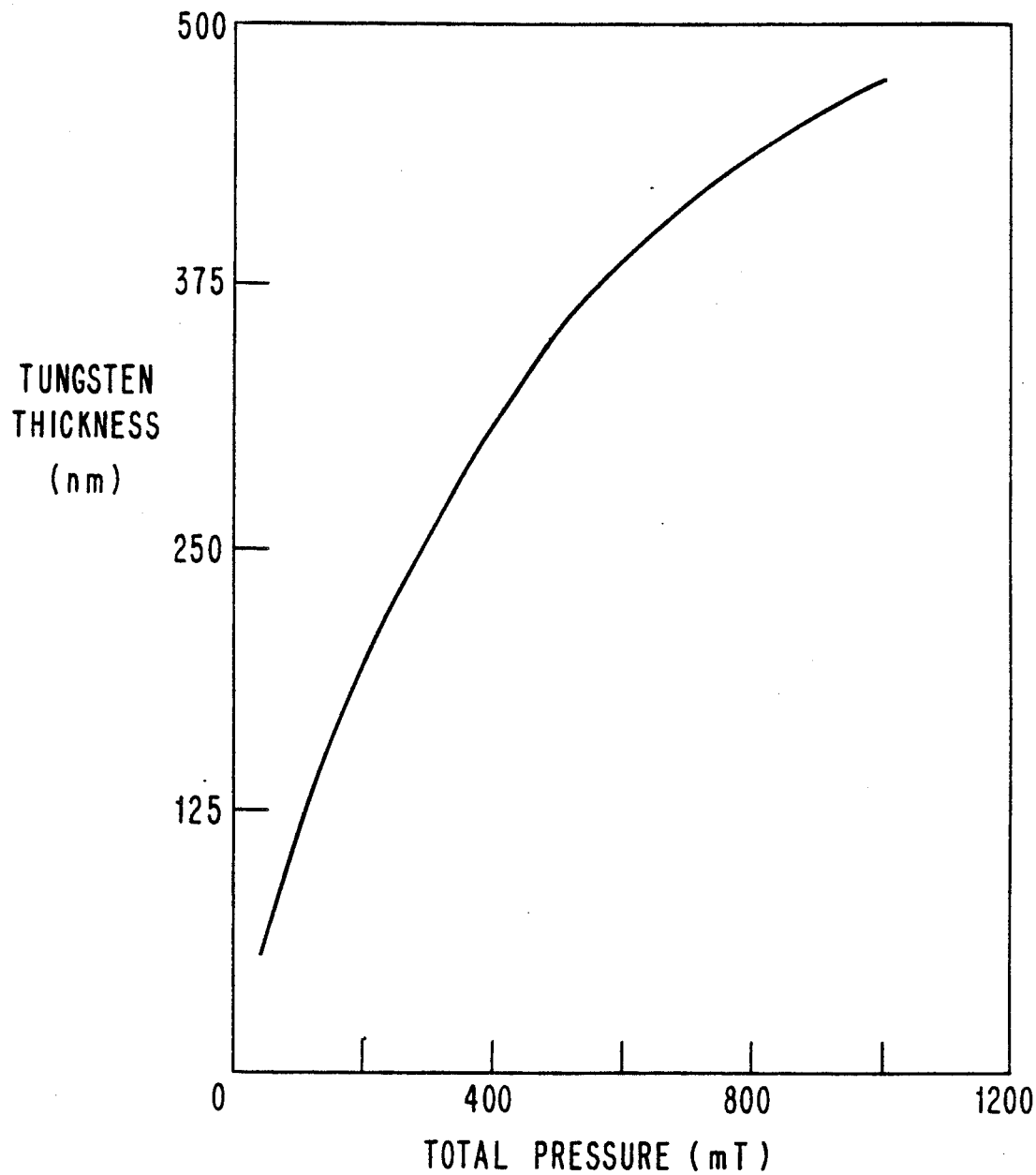
FIG. 7 is a graph showing the relationship between the tungsten thickness and the total pressure of the CVD environment.

Reference is now made to the graph of FIG. 7 showing the total pressure in mTorr versus the thickness of silicon converted to tungsten in nanometers. The pressure and thickness data was taken in an example in which the WF$_6$ flow rate was 15 SCCM and the carrier gas flow rate was 100 SCCM. The CVD environment temperature was 370° C. and the deposition time was five minutes. The graph of FIG. 7 shows that as the total pressure is increased, the thickness of the tungsten also increased. It has been found that the suitable range of pressure is between 200 and 2,000 mT.

Figure 8:
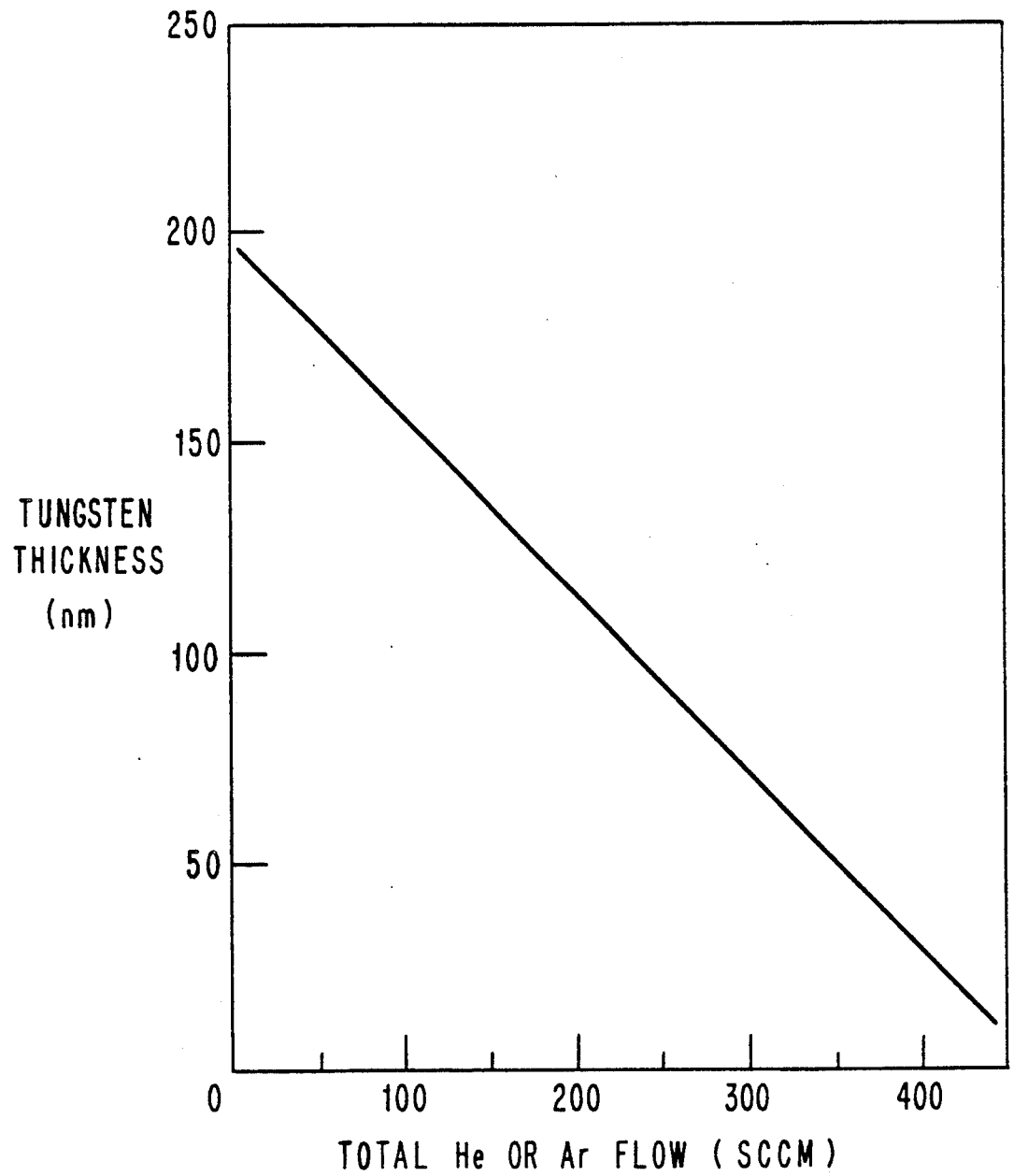
FIG. 8 is a graph showing the relationship between the tungsten thickness and the total carrier gas flow rate.
Figure 9:
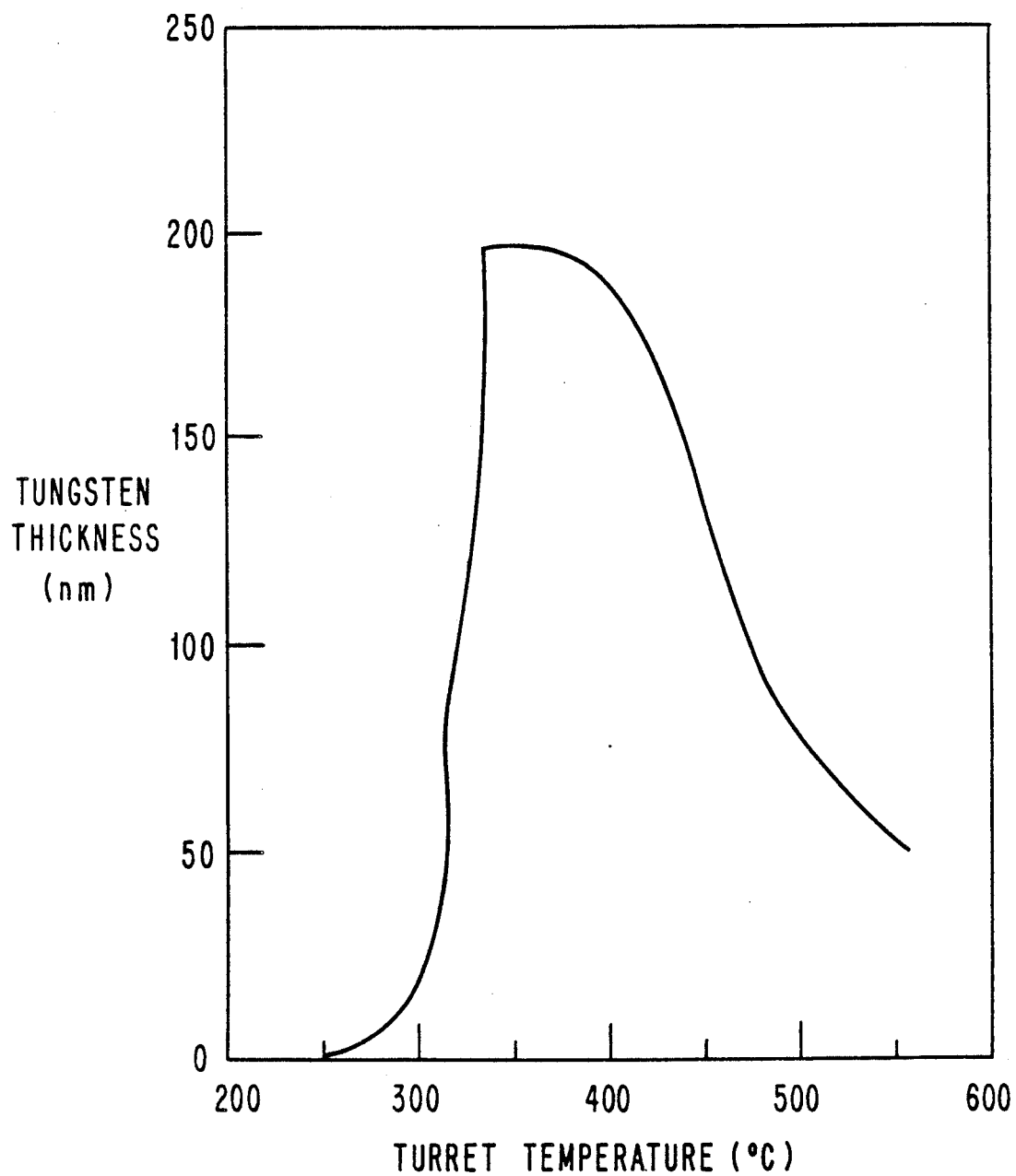
FIG. 9 is a graph showing the relationship between the tungsten thickness and the temperature of the CVD environment.
Figure 10:
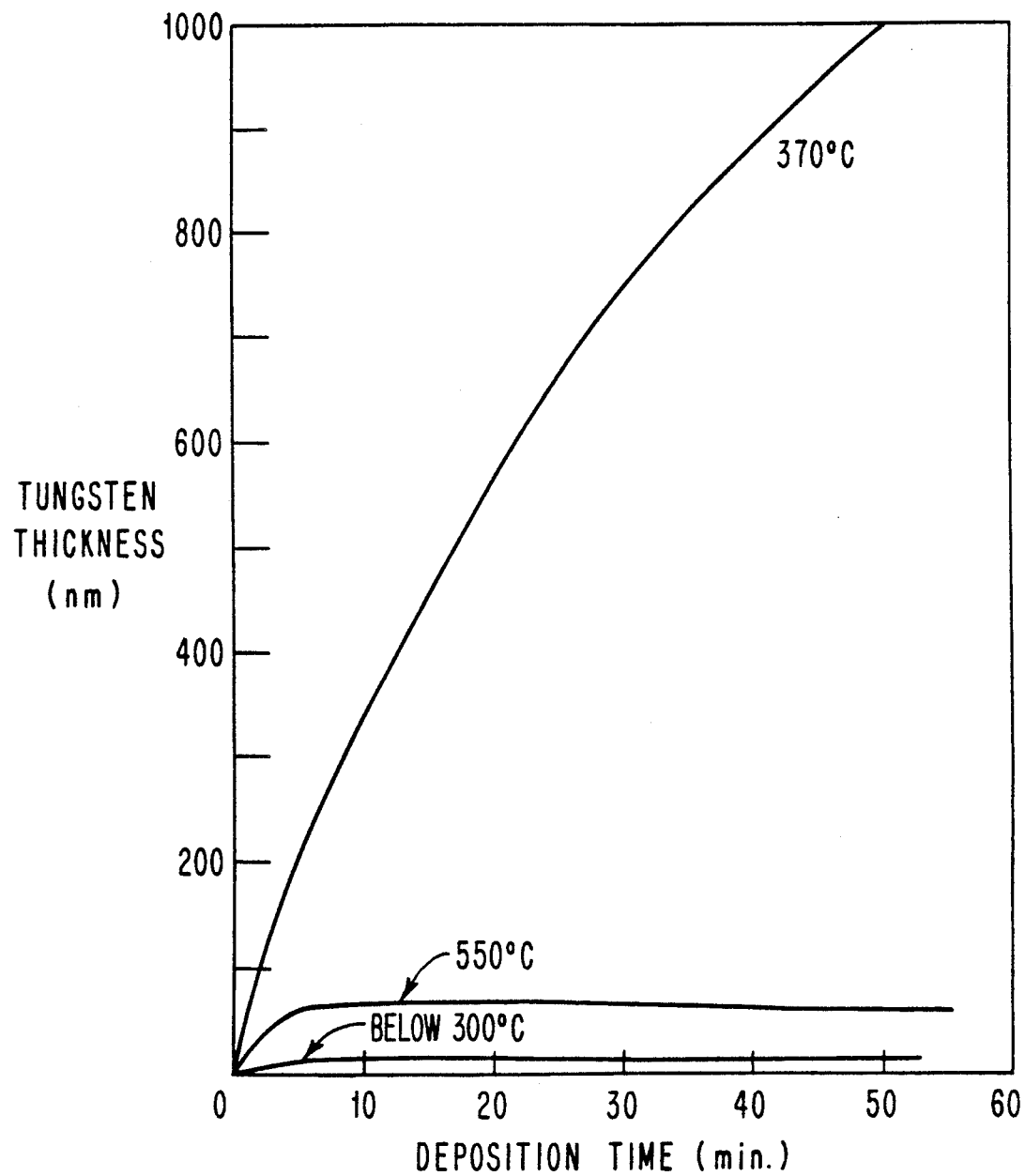
FIG. 10 is a graph showing the relationship between the tungsten thickness and the deposition time.

FIG. 8 shows the relationship between the carrier gas flow rate in SCCM and the tungsten thickness in nanometers. In this example the WF$_6$ flow rate was 15 SCCM, the total pressure was 200 mT, the deposition time was five minutes and the temperature was 370° C. The graph of FIG. 8 shows that as the flow rate increased the thickness decreased. The preferred range of carrier gas flow rate is, therefore, between 50 and 100 SCCM. FIG. 9 shows the relationship between the temperature in degrees centigrade and the tungsten thickness. In this example, the WF$_6$ flow rate was 15 SCCM, the carrier gas was 100 SCCM, the pressure was 200 mT and deposition time was five minutes. The graph of FIG. 9 shows that the preferred temperature range is between 300° or 500° C. FIG. 10 shows the relationship between the deposition time in minutes and the tungsten thickness. In this example, the WF$_6$ flow rate was 15 SCCM, the carrier gas flow rate was 100 SCCM, the pressure was 200 mT and temperature was 370° C. As can be seen, as the time increased the thickness of the tungsten also increased. Also shown in FIG. 10 are tests taken with the temperature below 300° C. and 550° C., which show that the thickness failed to increase upon increase of the deposition time. The optional WF$_6$ flow rate has been determined to be within the range of 10 to 40 SCCM with the preferred range being between 15 and 30 SCCM.

The partial pressure of the tungsten hexafluoride gas may be determined in accordance with the following formula:

$$P_{WF_6} = P_T \times \left[ \frac{S_{WF_6}}{S_{WF_6} + S_{He}} \right] \quad (3)$$

As can be seen in equation (3), the partial pressure is a function of the total pressure of the CVD environment and the tungsten and carrier gas, such as helium or argon, flow rates.

By calculation in accordance with equation (3), it can be determined that the partial pressure of the WF$_6$ gas is preferably within the range of 20 mT to 800 mT.

Thus, it has been shown that the tungsten thickness is the function of total pressure of tungsten hexafluoride gas flow. In addition, the tungsten thickness is also a function of the carrier gas flow rate, the temperature and the deposition time. Hence, it can be seen that by adjusting the partial pressure of the WF$_6$ gas, the thickness of the silicon converted to tungsten can be controlled so that part or all of the silicon source, drain and gate layers can be converted to tungsten.

After the conversion to tungsten, the structure can be annealed in forming gas or pure hydrogen below 900° C. for shallow junctions to reduce fluorine and oxygen in the film. After this step, routine oxide deposition and Al-Cu-Si metallization is performed for adding the ohmic contacts. For deep junctions, annealing can be performed above 1,000° C. Very little tungsten silicide is formed at these high temperatures. A possible reason for this is the incorporation of oxygen in the film which prevents silicide formation. Since epi-silicon is deposited on Si (100) the silicon consumption can be kept as low as possible, to reduce the contact resistance. The variation in sheet resistance is less than 5-6%. The process of the present invention has excellent reproduceability. The growth rate is approximately 100 to 200 nm per minute which is two orders of magnitude higher than the hydrogen reduction method for the same temperature. The resulting structure has a unique grain size of less than 10 nm.

Figure 11:
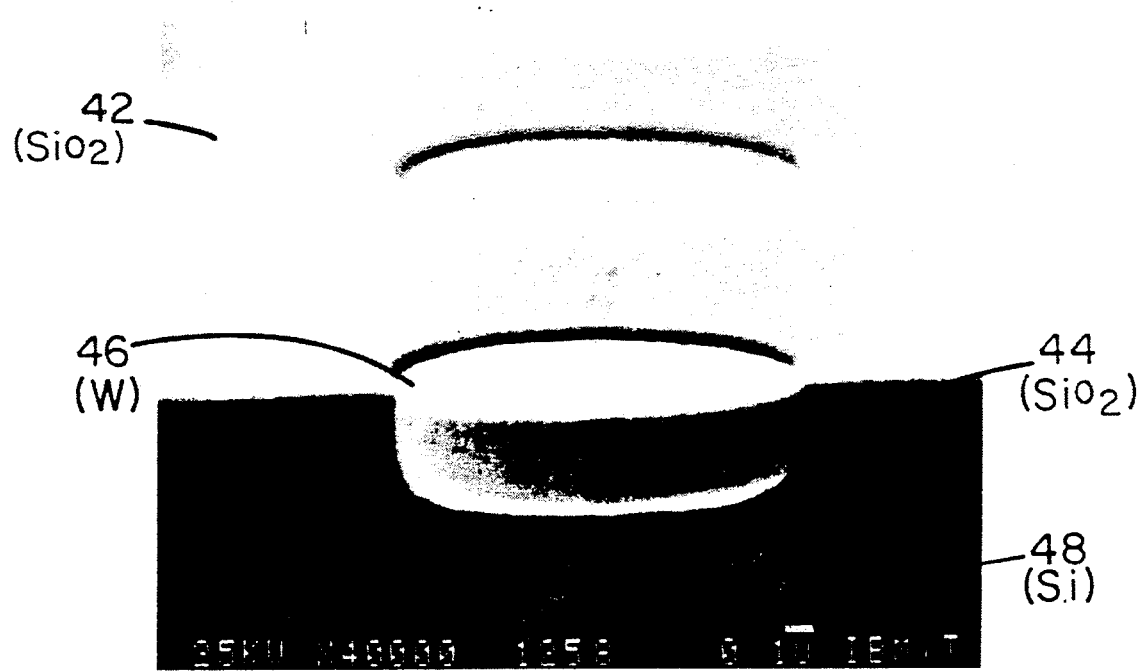
FIG. 11 is a photograph of the conversion of a multilevel interconnect via to tungsten.

The method of the present invention is also applicable to the planarization of vias for multi-level metal interconnects. The vias in a silicon oxide layer would first be filled with polysilicon and then exposed to the silicon reduction method of the present invention. The entire thickness of the vias can easily be converted to tungsten in a one step process. FIG. 11 is a photograph of a multi-level interconnect having SiO$_2$ levels 42 and 44 and an interconnect via 46 between Si substrate 48 and level 42. The via 46 was first filled with polysilicon and then converted to tungsten in accordance with the inventive process described above. The photograph shows that the entire via was converted to tungsten.

The method of the present invention makes it possible to easily convert source, drain and gate polysilicon to tungsten in one step without the prior art problems of encroachment or bridging. The resulting midgap gate semiconductor structure can be used for sub-half micron MOS devices. There is minimal differential height between the metallized source and drain. This topography simplifies the planarization of passivation layers. The process is 100% selective, thermally stable and results in low contact and sheet resistance for the structure. The process is reproduceable with a high growth rate of tungsten metallization for shallow junctions. By adjusting the process parameters, any desired thickness of silicon can be converted to tungsten utilizing a standard LPCVD cold wall reactor.

While the invention has been particularly shown and described with respect to preferred embodiments thereof, it will be understood by those skilled in the art that the foregoing and other changes in form and details may be made therein without departing from the spirit and scope of the invention.

Having thus described my invention, what I claim as new, and desired to be secured by Letters Patent is:

1. A method of depositing a non-self limiting layer of refractory metal on a substrate comprising:
   providing at least one area of silicon material having a predetermined thickness on a substrate;
   exposing said at least one area of silicon material to a refractory metal hexafluoride gas flow in a chemical vapor deposition environment defined by CVD process parameters to convert a layer of said silicon material to said refractory metal, said layer becoming increasingly thick as the conversion proceeds; and
   adjusting one or more of said metal hexafluoride gas flow and said CVD process parameters, including adjusting the temperature between 300° and 500° C., such that the conversion of the silicon material is not limited by the increasing thickness of the refractory metal.

2. The method of claim 1 wherein the CVD process parameters to be adjusted include, temperature, total pressure, partial pressure of the metal hexafluoride gas, and an inert carrier gas flow rate.

3. The method of claim 2 wherein the metal hexafluoride gas is $WF_6$.

4. The method of claim 3 wherein the $WF_6$ gas flow rate is between 10–40 SCCM and the inert carrier gas flow rate is between 50–100 SCCM.

5. The method of claim 4 wherein the total pressure is between 200 mT–2,000 mT and the partial pressure of $WF_6$ is between 20 mT–800 mT.

6. The method of claim 5 wherein the at least one area of silicon is selected from the group of single crystal silicon, polycrystalline silicon and amorphous silicon.

7. The method of claim 2 wherein the metal hexafluoride gas is MoF6.

8. A method of making a semiconductor device, comprising:
   providing a substrate of silicon material having a surface defining drain and source regions, a silicon gate of a first predetermined thickness having top, bottom and sidewalls of an insulator material disposed on said substrate surface adjacent said drain and source regions and recessed isolation regions disposed adjacent said source and drain regions spaced from said silicon gate;
   selectively depositing source and drain silicon of a second predetermined thickness on said source and drain regions respectively;
   removing said insulator material top wall from said silicon gate;
   exposing said substrate to a refractory metal hexafluoride gas flow in a chemical vapor deposition environment defined by CVD process parameters to convert a layer of said silicon material to said refractory metal, said layer becoming increasingly thick as the conversion proceeds; and
   adjusting one or more of said refractory metal hexafluoride gas flow and said CVD process parameters, including adjusting the temperature between 300° and 500° C., such that the conversion of the silicon material is not limited by the increasing thickness of the refractory metal.

9. The method of claim 8 wherein said silicon is selected from the group of single crystal silicon, polycrystalline silicon and amorphous silicon.

10. The method of claim 9 wherein said substrate is single crystal silicon and said silicon gate and said source and drain silicon layers are polycrystalline silicon.

11. The method of claim 10 further including the steps of selectively depositing spacers of insulator material in the interface areas between the isolation regions and the source and drain silicon layers and between the silicon gate and the source and drain silicon layers prior to exposing the substrate to hexafluoride gas flow.

12. The method of claim 11 wherein said insulator material and said isolation regions are selected from the group of $SiO_2$ and $Si_3N_4$.

13. The method of claim 8 wherein the CVD process parameters to be adjusted include temperature, total pressure, partial pressure of the metal hexafluoride gas, and an inert carrier gas flow rate.

14. The method of claim 13 wherein the metal hexafluoride gas is $WF_6$.

15. The method of claim 14 wherein the tungsten hexafluoride gas flow rate is between 10–40 SCCM and the inert carrier gas flow rate is between 50–100 SCCM.

16. The method of claim 15 wherein the total pressure is between 200 mT–2,000 mT and the partial pressure of $WF_6$ is between 20 mT–800 mT.

17. The method of claim 11 wherein the insulator spacers are selectively deposited by depositing a blanket layer of insulator material over the entire substrate, and etching said blanket layer while leaving a portion of said insulator layer in said interface areas.

18. The method of claim 16 wherein the first and second predetermined thicknesses are substantially the same.

19. The method of claim 16 wherein the second predetermined thickness is less than the first predetermined thickness.

20. The method of claim 8 wherein the at least one area of silicon material is provided by filling one or more vias of said predetermined thickness in an oxide layer disposed on a conducting substrate and whereby the silicon in the one or more vias is converted to tungsten up to said predetermined thickness.

21. A non-self limiting process for converting a semiconductor substrate material to a refractory metal which comprises:
   (a) contacting a semiconductor substrate material with a refractory metal hexafluoride in an environment adapted to convert a layer of said substrate material to the corresponding refractory metal, said layer becoming increasingly thick as the conversion proceeds; and
   (b) providing conditions of flow rate, pressure and a temperature between 300° and 500° C. such that the conversion of the substrate material is not limited by the increasing thickness of the layer of corresponding refractory metal.

22. The process of claim 21 wherein the refractory metal hexafluoride gas is $WF_6$.

23. The process of claim 22 wherein the $WF_6$ gas has a flow rate between 10–40 SCCM and is accompanied by an inert carrier gas having a flow rate between 50–100 SCCM.

24. The process of claim 23 wherein total pressure is between 200 mt–2000 mT and partial pressure of $WF_6$ gas is between 20 mT–800 mT.

* * * * *

UNITED STATES PATENT AND TRADEMARK OFFICE
CERTIFICATE OF CORRECTION

PATENT NO. : 5,071,788
DATED : December 10, 1991
INVENTOR(S) : Rajiv V. Joshi It is certified that error appears in the above-identified patent and that said Letters Patent is hereby corrected as shown below:

Column 6, line 56, Claim 1: "metal, said" should read as --metal by a silicon reduction reaction said--

Column 6, line 61, Claim 1: "temperature between should read as --temperature of said reaction to be between--

Column 7, line 35, Claim 8: "metal, said" should read as --metal by a silicon reduction reaction, said--

Column 7, line 39, Claim 8: "temperature between" should read as --temperature of said reaction to be between--

Column 8, lines 39-40, Claim 21: "metal, said" should read as --metal by a silicon reduction reaction, said--

Column 8, line 43, Claim 20: "temperature between" should read as --temperature of said reaction to be between--

Signed and Sealed this

Fourth Day of January, 1994

*Attest:*

BRUCE LEHMAN

*Attesting Officer*     *Commissioner of Patents and Trademarks*